United States Patent [19]

Usagawa et al.

[11] Patent Number: 5,381,027

[45] Date of Patent: * Jan. 10, 1995

[54] SEMICONDUCTOR DEVICE HAVING A HETEROJUNCTION AND A TWO DIMENSIONAL GAS AS AN ACTIVE LAYER

[75] Inventors: Toshiyuki Usagawa; Kenji Hiruma, both of Koganei; Masahiko Kawata, Hachioji; Shigeo Goto, Kokubunji; Katsuhiko Mitani, Kokubunji; Masao Yamane, Kokubunji; Susumu Takahashi, Tokyo; Tomonori Tanoue, Kawasaki; Yoshinori Imamura, Tsukui, all of Japan

[73] Assignee: Hitachi, Ltd., Tokyo, Japan

[ * ] Notice: The portion of the term of this patent subsequent to Nov. 2, 2010 has been disclaimed.

[21] Appl. No.: 134,622

[22] Filed: Oct. 12, 1993

Related U.S. Application Data

[63] Continuation of Ser. No. 884,878, May 18, 1992, Pat. No. 5,258,631, which is a continuation of Ser. No. 546,264, Jun. 29, 1990, abandoned, which is a continuation of Ser. No. 148,433, Jan. 26, 1988, abandoned.

[51] Int. Cl.6 .................. H01L 29/804; H01L 29/784
[52] U.S. Cl. .................... 257/192; 257/194; 257/26
[58] Field of Search ............. 257/15, 19, 192, 194, 257/26, 29

[56] References Cited

U.S. PATENT DOCUMENTS

| | | | |
|---|---|---|---|
| 4,558,337 | 12/1985 | Saunier et al. | 257/15 |
| 4,677,457 | 6/1987 | Wolter | 357/22 A |
| 4,695,857 | 9/1987 | Baba et al. | 357/4 |
| 4,806,994 | 2/1989 | Hayakawa et al. | 257/15 |
| 4,916,498 | 4/1990 | Berenz | 357/22 A |
| 4,937,204 | 6/1990 | Ishibashi et al. | 357/34 |
| 4,987,462 | 1/1991 | Kim et al. | 257/192 |
| 5,258,631 | 11/1993 | Usagawa et al. | 257/194 |

FOREIGN PATENT DOCUMENTS

| | | | |
|---|---|---|---|
| 58-51575 | 3/1983 | Japan | 357/22 A |
| 60-45070 | 3/1985 | Japan | 357/22 K |
| 62-33461 | 2/1987 | Japan | 357/34 |

Primary Examiner—Rolf Hille
Assistant Examiner—Wael M. Fahmy
Attorney, Agent, or Firm—Antonelli, Terry, Stout & Kraus

[57] ABSTRACT

This invention discloses a heterojunction type field effect transistor such as 2DEG-FET and a heterojunction type bipolar transistor such as 2DEG-HBT. The former is fabricated by applying to the formation of its source and drain regions a technique which causes the disorder of the heterojunction by intoduction of an impurity such as by ion implantation or a technique which causes the disorder of the heterojunction by forming a film made of at least one kind of material selected from insulators, metals and semiconductors which have a different linear coefficient of thermal expansion from that of the material of a semiconductor substrate on the heterojunction semiconductor region which is to be disordered. The latter is fabricated by applying either of the techniques described above to a base ohmic contact region. These semiconductor devices can reduce the source-gate resistance and the parasitic base resistance. The invention discloses also the structure of the ohmic contact layer which has a trench on the surface thereof and is particularly effective for reducing the source-gate parasitic resistance.

18 Claims, 10 Drawing Sheets

SEMICONDUCTOR DEVICE HAVING A HETEROJUNCTION AND A TWO DIMENSIONAL GAS AS AN ACTIVE LAYER

This is a continuation of application Ser. No. 07/884,878 filed May 18, 1992 now U.S. Pat. No. 5,258,631, which is a continuation of application Ser. No. 07/546,264 filed Jun. 29, 1990, now abandoned; which is a continuation of application Ser. No. 07/148,433 filed Jan. 26, 1988, now abandoned.

BACKGROUND OF THE INVENTION

1. Field of the Invention

This invention relates to a technique of forming an ohmic contact to a two-dimensional carrier which is formed on a heterojunction interface, and more particularly to a semiconductor device which can reduce a source-gate resistance or a parasitic base resistance and can operate at a high operation speed, and fabrication method of such a semiconductor device.

2. Description of the Prior Art

The technical concept of using two-dimensional electron gas (hereinafter called "2DEG") formed on a heterojunction interface between n-type AlGaAs (aluminum gallium arsenide) and undoped GaAs (gallium arsenide) for the active layer of a field effect transistor (FET) is disclosed, for example, in Japanese Patent Laid-Open No. 160473/1980. Such an FET is generally called "two-dimensional electron gas field effect transistor (2DEG-FET)". The greatest problem for accomplishing high performance of 2DEG-FET is the reduction of a source-gate resistance ($R_{sg}$). FIG. 2(a) of the accompanying drawings is a sectional view of 2DEG-FET having a conventional structure and FIG. 2(b) is a band diagram of a conduction band energy in the proximity of a source electrode.

Namely, 1 μm-thick undoped GaAs 11, about 50 nm-thick n-type $Al_xGa_{1-x}As(x \sim 0.3)$ 12 and 50 nm-thick n+GaAs 13 are formed on a semi-insulating GaAs substrate 10. A gate electrode 22 forms a Schottky junction with n-type AlGaAs 12 while source-drain electrodes 20, 21 form an alloy junction with n+GaAs 13. Here symbol $\phi_{Bn}$ represents the Schottky barrier height between the source electrode 20 and n+GaAs 13.

FIG. 2(b) shows the conduction energy band diagram in the proximity of the source electrode 20 (A-A'). Unlike the ohmic contact of ordinary GaAs MESFET (Metal Semiconductor Field Effect Transistor), the heterojunction is formed between n+GaAs 13 and n-type AlGaAs 12 in the case of 2DEG-FET and the heterojunction is formed also between n-type AlGaAs 12 and undoped GaAs 11. Therefore, a potential barrier $\Delta E_c$ is formed between 2DEG 14 and the ohmic metal 20 and specific contact resistance $R_c$ occurs between n+GaAs 13 and 2DEG, thereby causing a critical problem for reducing $R_{sg}$. The specific contact resistance $R_c^{TLM}$ between the source electrode 20 and n+GaAs 13 alone is the problem in the case of ordinary GaAs MESFETs, but the reduction of the specific contact resistance $R_c$ between the heterojunctions becomes the problem in the case of 2DEG-FET.

It is known of late that if heat-treatment is made by injecting Si ions, the heterojunction interface becomes broken down and AlGaAs/GaAs system superlattice becomes disordered, as discussed in the papers of "Opto-Electronics Joint Research Laboratory, 13th Conference" (1986), pp. 25-33. This disorder is believed to result from mutual diffusion of Ga and Al due to diffusion of Si.

As one of the methods of reducing $R_{sg}$, a method which injects Si ions exhibiting the n type into the source-drain region and activates it has been employed. However, this method involves the problem that a high temperature process around 800° C. is necessary as the activation temperature and a layer below the gate electrode becomes disordered, also. If a refractory gate metal is used as a masking material for the ion injection, the Si ions are diffused below the two-dimensional electron gas so that the shift of the threshold voltage ($V_{th}$) of the transistor to the negative side, or so-called "short channel effect", becomes the problem.

In addition, the impurity distribution in AlGaAs 12 changes through the high temperature heating process so that $V_{th}$ shifts, as well.

On the other hand, heterojunction bipolar transistors (hereinafter called "HBTs") of gallium arsenide (GaAs) and aluminum gallium arsenide (AlGaAs) have been fabricated conventionally in accordance with crystal growth methods such as MBE (Molecular Beam Epitaxy) or MODVD (Metal Organic Vapor Phase Epitaxy) comprising the steps of sequentially growing crystallographically n-type GaAs (collector), p+GaAs (base), n-type AlGaAs (emitter) and n+GaAs (cap layer) and then forming the emitter region, the base region, the base electrode, the collector electrode, the collector region, and so forth. (Refer, for example, to "IEDM Technical Digest 1985", pp. 328-331.) As is well known in the art, however, the emitter concentration, i.e. $10^{20}$ cm$^{-3}$, is by far higher than the base concentration, i.e. $10^{18}$ cm$^{-3}$, in the case of Si bipolar transistors. Accordingly, the emitter region can be formed by ion implantation after the formation of the base region and extremely fine n-p junction region can be realized. As a result, an extremely fine emitter can be formed. (Refer, for example, to "Electronics Lett.", Vol. 19, No. 8, April, 1983, p. 283.)

In contrast, in the case of HBT, the impurity concentration of the base region is ordinarily from $10^{18}$ to $10^{19}$ cm$^{-3}$ while the AlGaAs impurity concentration of the emitter region is ordinarily from $10^{17}$ to $10^{18}$ cm$^{-3}$ in order to reduce the base resistance and because the upper limit exists to the emitter concentration. In other words, the impurity concentration of the emitter region is ordinarily lower than that of the base region.

Therefore, unlike the Si bipolar transistors, HBT involves the problem that the emitter region cannot be formed by ion implantation after the base region is formed.

Since the emitter region is formed by epitaxial growth process such as MBE/MOCVD or the like, it has been extremely difficult to etch finely (~0.5 μm level) the emitter region unlike ion implantation.

SUMMARY OF THE INVENTION

In accordance with the prior art technique described above, the heterojunction is formed excessively sharply between the source (or the drain) and the gate so that the specific contact resistance $R_c$ develops and the source-gate resistance $R_{sg}$ cannot be reduced.

It is therefore the first object of the present invention to provide a structure which reduces the specific contact resistance $R_c$ at the heterojunction and to improve performance of 2DEG-FET by implementing a structure wherein the heterojunction vertically orthogonally beneath the source (or drain) and between the source (or the drain) and the gate collapses gently (see FIGS. 1(a), (b) and (d) and) while keeping sharp the heterojunction in the proximity of the gate (that is, while the Al mixed crystal ratio x changes spatially abruptly (see FIGS. 1(a), 1(c) and 1(e))).

It is the second object of the present invention to fabricate a transistor which reduces parasitic resistance and has a low short channel effect by causing disorder on the heterojunction interface without using ion implantation.

It is the third object of the present invention to provide a field effect transistor having an extremely small source-gate parasitic resistance.

In accordance with the conventional 2DEG-FET structure (see FIG. 10), the AlGaAs layer 124 having a large band gap exists between the source electrode 125 and the channel portion 123 of the two-dimensional electron gas so that it has been extremely difficult to reduce the parasitic resistance of the source-gate electrodes.

To solve the problem described above, an ohmic electrode contact layer 135 is formed on the AlGaAs layer 134 as shown in FIG. 11. This contact layer uses GaAs, having a smaller band gap than AlGaAs, which is doped thereto in a high concentration. Therefore, this contact layer has a small contact resistance. Since the thickness of the contact layer 135 is as great as at least 100 Å, two electron paths 139, 140 can be secured and a large current can flow. In other words, the parasitic resistance between the source and gate can be effectively reduced. However, the parasitic resistance must be further reduced in order to increase transconductance to above 300 ms/mm.

It is therefore the fourth object of the present invention to provide HBT which is suitable for forming a fine emitter, can employ a planar structure and can be formed on the same substrate as GaAs FET.

In other words, since an impurity is doped into the emitter region by epitaxial technique in accordance with the prior art technique described above, the structure is not suitable for reducing finely the emitter size. To form the emitter region, it has been customary to remove by etching or a like technique the regions other than the emitter region. Therefore, there has been the problem that the technique is not easily converted to a planar process. When HBT and GaAs MESFET are fabricated on the same substrate by the conventional HBT technique, it has been difficult to fabricate MESFET having high performance.

The first object of the invention described above can be accomplished by diffusing or ion-implanting those impurity atoms which turn to p-type after ion implantation and heating (hereinafter called the "p-type impurity") or those atoms which remain neutral after heating (hereinafter called the "neutral impurity") into both or one of the source and drain regions, and then effecting annealing at a relatively low temperature.

FIGS. 1(a), (b), (c), (d) and (e) show a typical sectional view of 2DEG-FET in accordance with the present invention, the spatial distribution of the Al composition of the principal portions (FIGS. 1(b), (c)) and its energy band diagrams of the conduction band (FIGS. 1(d), (e)). Reference numeral 11 in FIG. 1(a) represents an undoped GaAs; 12 is an n-type AlGaAs layer whose Al composition is fixed to 0.3; 13 is an n+GaAs layer, 20 and 21 are source-drain electrodes; 22 is a gate electrode; and 12' is an AlGaAs layer whose Al composition is graded.

As described, for example, in "Appl. phys. Lett." 3.8 (1981), p. 776, it is known that when a p-type impurity such as Zn is diffused into the GaAs/AlGaAs superlattice, diffusion of the Al atoms occurs and the superlattice becomes disordered.

Diffusion of Al occurs in the single heterojunction, too, and the Al atoms diffuse in the sharp heterojunction of GaAs/AlGaAs/GaAs (layers 11, 12, 13) and Al is distributed spatially as shown in FIG. 1(b). Accordingly, the contact resistance in the heterojunction is eliminated.

In other words, the distribution of the Al composition is graded as shown in FIG. 1(b), and the heterojunction of the source-drain regions exhibits a continuous change from GaAs to AlGaAs due to the diffusion of the Al atoms. At this time, the potential barrier resulting from the band gap of the heterojunction (speaking electronically, the potential barrier $\Delta E_c$ of the conduction band; see FIG. 1(d) disappears and an ohmic mechanism is established in the source-drain regions in the proximity of the source-drain electrodes in the same way as in the case of GaAs MESFET of ordinary homojunction.

Since the conductivity type of the impurity atom is not the same as that of the 2DEG layer, it is possible to prevent the short channel effect due to the extension of the impurity atoms below the 2DEG layer.

Since the heterojunction below the gate electrode is sharp (see FIGS. 1(c), (e)), n-type GaAs can be removed accurately and selectively by etching after the gate electrode is formed.

When the neutral atoms such as F or Ar ions are implanted, they can be diffused by annealing process at a low temperature around 650° C. (crystal growing temperature at the time of crystal growth by HBE or the like) and the original carrier concentration of the n-type GaAs and AlGaAs regions can be maintained. In other words, disorder of Al is caused at a relatively low temperature and the n-type impurity such as the Si atoms can be kept under the activated state.

Examples of the neutral atoms whose implanted atoms cause diffusion and eventually, the disorder of the Al composition, include P (proton), As, B, Xe and Ne besides F and Ar.

When the p-type impurity such as Zn is implanted, a p-type GaAs region is formed below the two-dimensional electron gas and the short channel effect due to reduction of the gate length can be reduced.

In the present invention, the dose of the impurity atoms is from $1 \times 10^{13}$ to $5 \times 10^{19}$ cm$^{-3}$ and the annealing temperature is from 500° to 900° C.

Though various mixed crystal system semiconductors may be used in the present invention, typical examples are GaAs/AlGaAs and InP/GaAs.

The second object of the present invention described above can be accomplished by forming selectively materials such as insulating layer having different linear coefficients of thermal expansion from that of the semiconductor material of the substrate on the semiconductor layer having the heterojunction and then heat-treating the same.

As tabulated in Table 1 below, examples of the materials having a remarkably different linear coefficient of thermal expansion from that of the GaAs substrate include SiO$_2$ and Si$_3$N$_4$ as the insulating materials and Si as the semiconductor material.

TABLE 1

| Material | linear coefficient of thermal expansion ($\times 10^{-6} C^{-1}$) |
|---|---|
| GaAs | 5.8 |
| SiO$_2$ | 0.53 |
| Si$_3$N$_4$ | 2.11 |
| Si | 2.5 |
| AlN | 4.8~6.0 |
| W | 4.4~5.05 |
| SiC | 5.2 |

The material described above is selectively formed at the upper part of the AlGaAs/GaAs. heterojunction layer by dry-etching and is heat-treated in AsH$_3$, whereupon thermal strain occurs in the crystal of the lower part of the layer on which the material is formed selectively and the heterojunction interface gets disordered. However, the heterojunction interface is maintained at the portion exposed on the substrate and selective disorder can thus be established.

When the material having a remarkably different linear coefficient of thermal expansion from that of the GaAs substrate tabulated in Table 1 is formed on the semiconductor layer having the heterojunction and heat-treated, thermal strain develops in the substrate. FIG. 8 shows the profiles of Ga (62) and Si (63) in the direction of depth by secondary ion mass analysis when the materials having a remarkably different linear coefficient of thermal expansion (SiO$_2$, SiN, Si) are formed selectively at the upper part of the AlGaAs/GaAs heterojunction layer and heat-treated in AsH$_3$. Reference numeral 60 in FIG. 8 represents the profile of Al when no cap material exists on GaAs and the interface with GaAs is sharp. Reference numeral 61 represents the region in which SiO$_2$ is formed, where Al is diffused and the heterojunction interface gets disordered. Therefore, selective disorder is established and moreover, since no ions are implanted, diffusion of Si hardly occurs.

The third object of the present invention described above can be accomplished by forming a trench, particularly a trench having a lattice structure, on the surface of a semiconductor contact layer of an ohmic electrode.

This contact layer is preferably at least 500 Å thick but if it is more than 2 μm thick, the greater effect of the present invention cannot be obtained and the cost of production will increase.

Since the lattice structure is formed on the surface of the contact layer, the contact area with the ohmic electrode can be increased and the electron injection quantity can be increased near the edge portion on the bottom of the trench. Accordingly, the contact resistance can be reduced remarkably.

Speaking semi-microscopically, the increase of the contact area with the electrode due to the trench means the increase of the electron paths in the contact layer 115 as represented by arrows in FIG. 9, and the parasitic resistance can be reduced effectively.

Furthermore, if a contact layer having one conductivity type which is doped in a high concentration and is thick (at least 500 Å) is used as the contact layer for the ohmic electrode, the contact resistance can be reduced and the electron paths become two-fold (139 and 140 in FIG. 11), so that the parasitic resistance between the source-gate electrodes can be reduced.

The fourth object of the present invention described above can be accomplished by forming the emitter region above the base layer by epitaxial technique such as MBE/MOCVD without doping (undope; p type up to $10^{15}$ cm$^{-3}$), then forming the emitter region and base extension regions of HBT by ion implantation and forming the active layer of FET by ion implantation. The reason why HBT can be formed by such a technique is as follows. Since the concentration of the base region is from $10^{18}$ to $10^{19}$ cm$^{-3}$ and by far greater than that of the emitter region, the n-type impurity entering the p-type region during the formation of the emitter region, in which an n-type impurity of $10^{17}$ to $10^{18}$ cm$^{-3}$ is implanted, can be neglected. Furthermore, the n-p junction position can be registered substantially completely with the heterojunction position by making some contrivances so as to prevent large amount of the p-type impurity of the base region during the annealing process of the implanted n-type impurity, and the characteristics of HBT are not deteriorated.

It is also possible to first form and bury the collector region into the semi-insulating GaAs substrate, then to sequentially form undoped GaAs, p+GaAs, undoped AlGaAsAs and GaAs, to implant n+ ion and thereafter to implant p+ ion for forming the base extension region of the p+GaAs baser layer. It is further possible to remove the emitter and collector layers and to grow epitaxially the emitter layer on the entire surface by MBE or the like, or to form it selectively in the semi-insulating substrate, to grow epitaxially the base region p+GaAs layer, then to form the undoped GaAs layer and thereafter to form selectively the collector layer into the surface by n+ ion implantation.

Next, the outline of the present invention will be described about the case where GaAs/AlGaAs HBT is taken as an example, with reference to FIGS. 12(a) and (b). There is formed on the semi-insulating GaAs substrate 210 an n+GaAs layer 211, an n−GaAs layer 212 as the collector and p+GaAs layer 213 by MBE/MOCVOD in the same way as in the prior art devices, an undoped AlGaAs layer 214 (residual level of ~p−$10^{15}$ cm$^{-3}$), and an undoped GaAs layer 215 (FIG. 12(a)) are formed sequentially.

A p+ base extension region 221 and an n-type emitter region 220 are then formed by ion implantation. An n-type active layer 224 of GaAs FET and an n+ layer 223 are formed also by ion implantation by utilizing the undoped layers 215 and 214. Reference numerals 231 and 232 represent source and drain electrodes while reference numeral 230 represents a gate electrode. Reference numerals 233 and 235 represent emitter and collector electrodes and reference numeral 234 represents a base electrode. Reference numeral 222 represents an n+ extension region (FIG. 12 (b)) from the collector region 211. The reason why the emitter region can be formed as described above by ion implantation is as follows. Namely, since the doping level on the emitter side is by far lower than that on the base side as shown in FIG. 12(c), the n-type impurity entering the base region hardly affects the impurity level of the base region.

This makes use of the property inherent to the heterojunction that the doping level of the base region can be increased by use of the heterojunction.

As described above, since the emitter region and the GaAs FET region can be formed while the emitter layer is kept undoped and then by use of ion implantation, the emitter region can be made delicate at substantially the same level as FET. The base extension region can be easily formed in the planar structure by ion implantation.

Since the emitter region is formed by ion implantation and since the emitter region is the only ion implantation portion, the parasitic resistance between the emitter and the base can be made extremely small.

DESCRIPTION OF THE PREFERRED EMBODIMENTS

Hereinafter, some preferred embodiments of the present invention will be described.

Embodiment 1

Figure 1A:
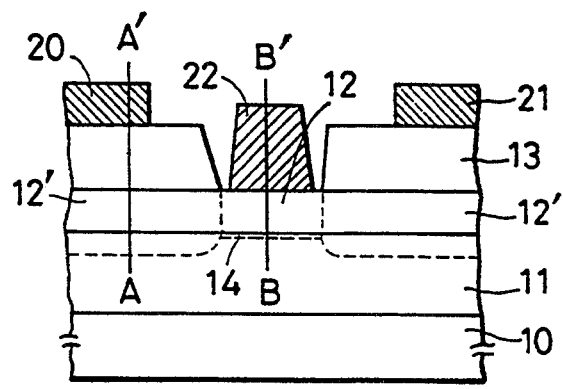
FIG. 1(a) sectional view of 2DEG-FET useful for explaining the principle of Embodiments Nos. 1 to 4 of the present invention.
Figure 1B:
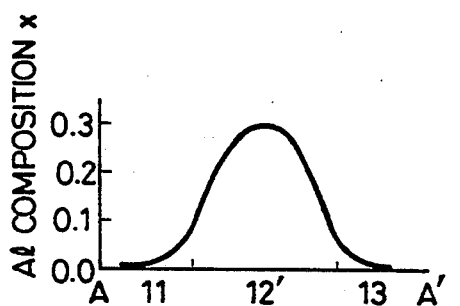
FIG. 1(b) is a distribution diagram of an Al composition x at A-A' portion of FIG. 1(a)
Figure 1C:
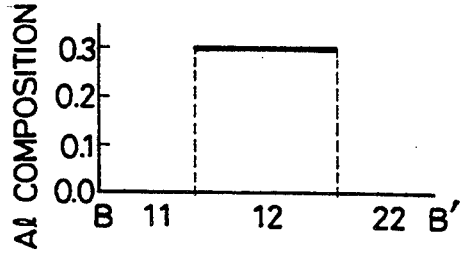
FIG. 1(c) is a distribution diagram of the Al composition x at B-B' portion of FIG. 1(a)
Figure 1D:
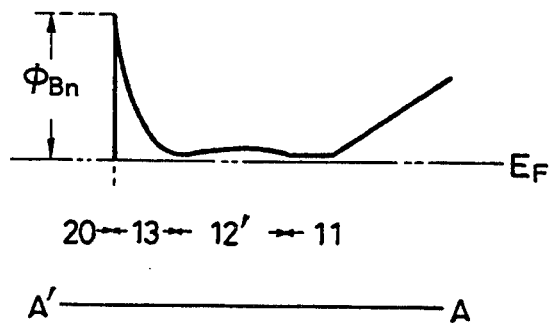
FIG. 1(d) is a conduction band diagram of the portion A-A' of FIG. 1(a)
Figure 1E:
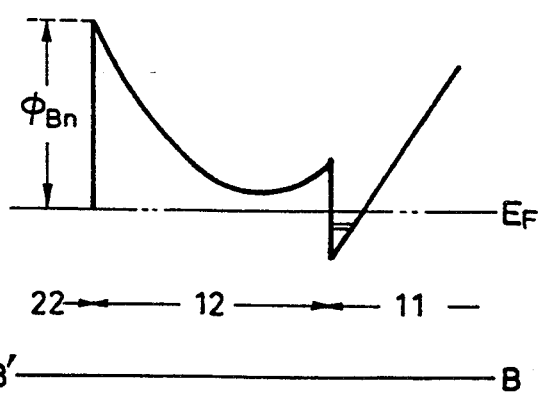
FIG. 1(e) is a conduction band diagram of the portion B-B' of FIG. 1(a)
Figure 2A:
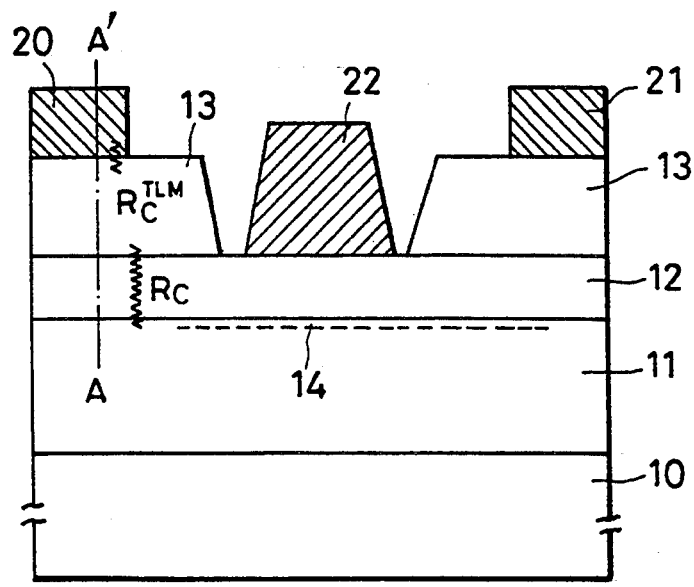
FIG. 2(a) is a sectional view of conventional 2DEG-FET.
Figure 2B:
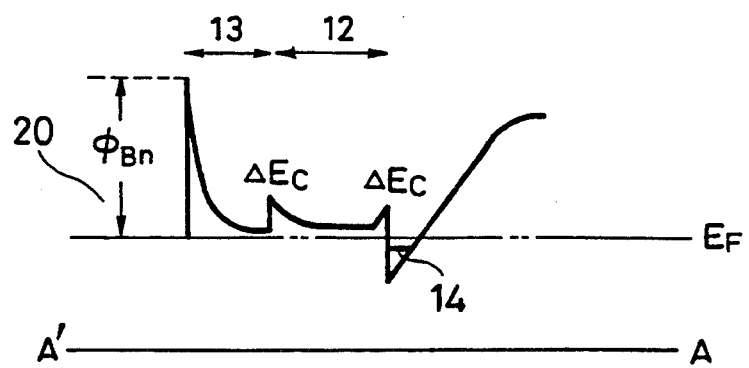
FIG. 2(b) is a conduction band diagram of the portion A-A' of FIG. 2(a)
Figure 3A:
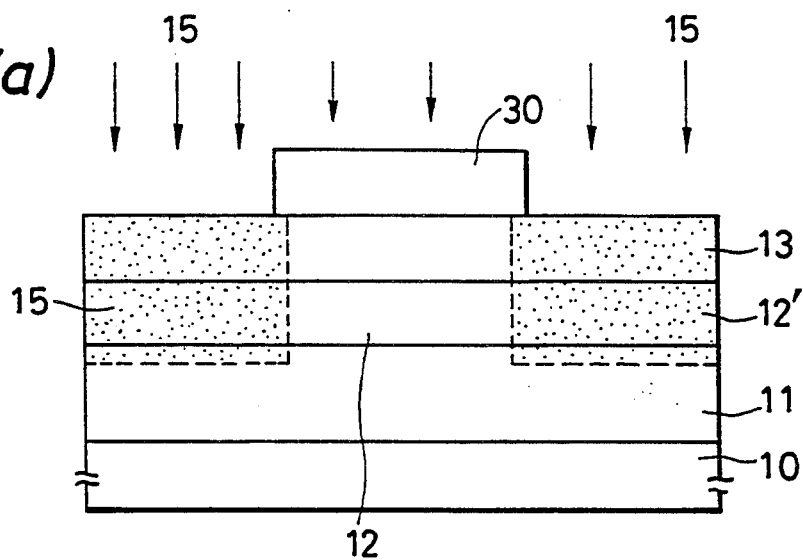
FIGS. 3(a) and 3(b) are sectional views showing the fabrication steps of 2DEG-FET in the first embodiment of the present invention.

The first embodiment of the present invention, wherein the invention is applied to AlGaAs/GaAs 2DEG-FET, will be described with reference to FIGS. 3(a), (b) and (c).

A 500 nm-thick undoped GaAs layer 11, a 50 nm-thick $Al_xGa_{1-x}As$ ($0.1 \leq x \leq 0.4$) layer 12 containing about $1 \times 10^{18}$ cm$^{-3}$ of Si and a 20 to 160 nm-thick n+GaAs layer 13 containing about $2 \times 10^{18}$ cm$^{-3}$ are formed by MBE (Molecular Beam Epitaxy) on a semi-insulating GaAs substrate 10, and Zn ions 15 in the dose of $1 \times 10^{13}$ cm$^{-2}$ is implanted at an acceleration voltage of 120 keV into the source-drain regions using a photoresist 30 as the mask. (FIG. 3(a)).

Figure 3B:
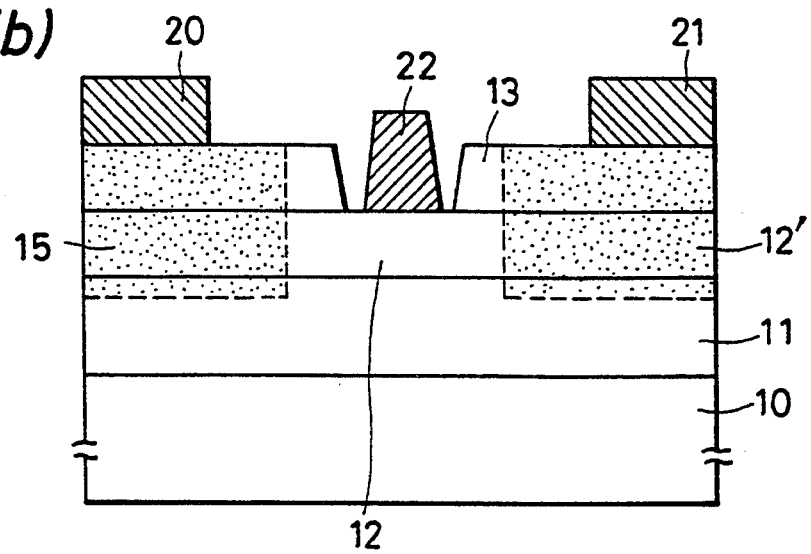

After the photoresist 30 is removed, 200 nm-thick SiN is formed on the entire surface and annealed at 600° to 800° C. for 20 minutes by lamp annealing. Then, gate 22 and source-drain electrodes 20, 21 are formed through ordinary steps (FIG. 3(b)).

In order to cause the disorder of the Al composition without breaking the heterojunction below the gate electrode portion and without increasing the carrier concentration of the n-type AlGaAs layer 12 and GaAs layer 13 of the source-drain region, however, heat-treatment is necessary after ion implantation whichever atoms are implanted. In such a case, measures must be taken lest defect occurs at the Schottky junction of the gate electrode with respect to the AlGaAs layer 12 due to heat-treatment.

Figure 3C:
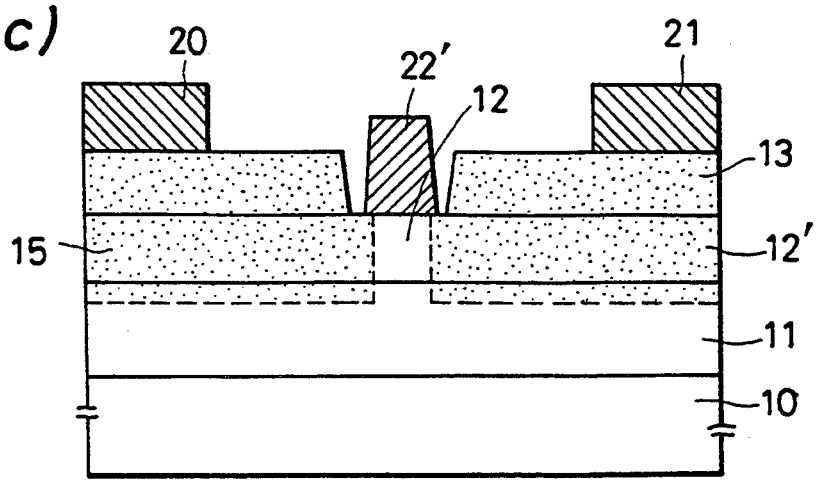
FIG. 3(c) is a sectional view showing a modified example of 2DEG-FET in the first embodiment.

FIG. 3(c) represents that Zn 15 or the like that causes the disorder of Al can be implanted by use of a high refractory metal 22' as the masking material.

Zn behaves as the p-type impurity after annealing but the n-type region can be kept as an n-type region without causing its inversion to that of a p-type by keeping the Si concentration of the n-type GaAs layer 13 and the n-type AlGaAs layer 12 high enough (to the level of up to $2 \times 10^{18}$ cm$^{-3}$).

The undoped GaAs layer 11 portion changes to a weak p-type by ion implantation of Zn and subsequent heat-treatment, and this is effective for limiting the so-called short channel effect. This is the remarkable effect by implanting such an impurity which changes to the p-type after annealing.

In other words, if Si is implanted in an ordinary manner, the ohmic contact can be improved, it is true, but an n+ region is formed slantingly below the 2DEG layer so that the short channel effect occurs. The short channel effect means the phenomenon wherein a threshold voltage $V_{th}$ shifts to the negative side during the process in which the gate length $L_g$ becomes short from 1 μm to 0.3 μm, for example.

In order to cause the disorder of the Al composition without greatly decreasing the carrier concentration of the n+GaAs layer 13, p-type impurities such as Be and Ge and those impurities which turn to neutral after heating, such as F, Ar, Ne, Xe and proton, may be used besides Zn atoms.

In the case of Ar, for example, the Al composition gets disordered when Ar++ is implanted in the dose of $4 \times 10^{13}$ cm$^{-3}$ at an acceleration voltage of 150 keV and heat-treatment is made at 680° C. for 20 minutes. The improving effect can be obtained in the dose of a $1 \times 10^{12}$ cm$^{-2}$ level if the disorder is at such a level which is directed to ohmic contact.

If n+GaAs 13 is used in order to reduce the source-gate resistance $R_{sg}$ in this embodiment, its thickness must be great such as 160 nm, for example. It is possible to use n+Ge containing about $10^{20}$ cm$^{-3}$ of As in place of n+GaAs 13. In this case, the disorder of the heterojunction occurs primarily between the AlGaAs layer 12 and the GaAs layer 11.

Embodiment 2

Figure 4A:
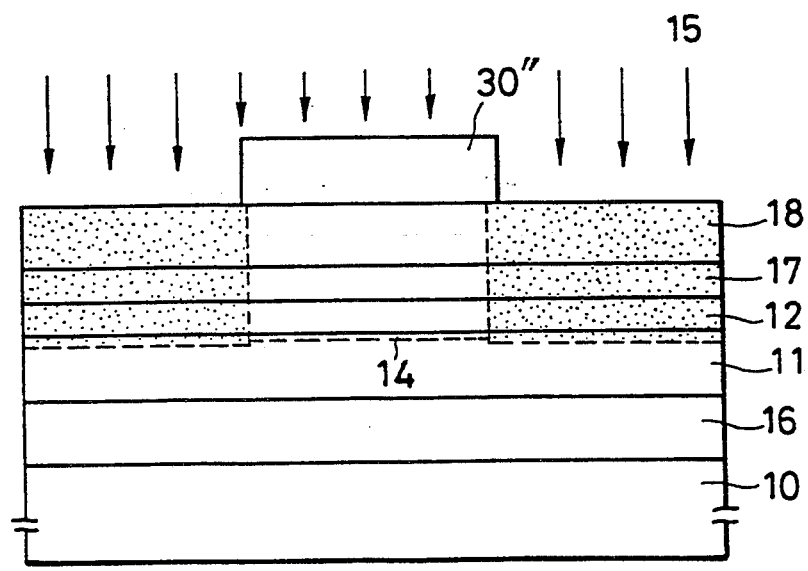
FIGS. 4(a) and 4(b) are sectional views showing the fabrication steps of 2DEG-FET in the second embodiment of the present invention.
Figure 4B:
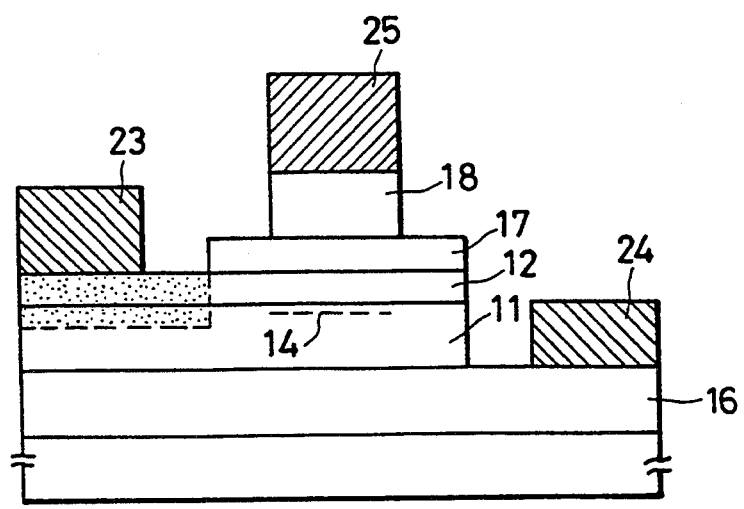

The second embodiment of the present invention, wherein the invention is applied to 2DEG-HBT using the two-dimensional electron gas for the base layer, is shown in FIGS. 4(a) and 4(b).

A 500 nm-thick $p^+$GaAs layer 16 containing $1 \times 10^{19}$ cm$^{-3}$ of Be, a 300 nm-thick undoped GaAs layer 11, a 40 nm-thick n-type AlGaAs layer 12 containing $2 \times 10^{18}$ cm$^{-3}$ of Si, a 50 nm-thick $p^+$AlGaAs layer 17 containing $2 \times 10^{19}$ cm$^{-3}$ of Be and a 200 nm-thick $p^+$GaAs layer 18 of the same doping level are formed on a semi-insulating GaAs substrate 10 by MBE.

Subsequently, Zn is implanted in the dose of $3 \times 10^{13}$ cm$^{-2}$ at an acceleration voltage of 250 keV into the base region portion using SiN 30" as the mask (FIG. 4(a)). After this SiN 30" is removed, $SiO_2$ (which is 200 nm thick) is deposited by CVD and then annealing is carried out at 650° C. for 30 minutes in $H_2$ atmosphere. Next, the emitter electrode 25, the base electrode 23 and the collector electrode 24 are formed through ordinary steps (FIG. 4(b)).

In this embodiment, it is possible to use F, Ge, Be, As, Ar, proton or the like besides Zn as the ions to be implanted.

Though the foregoing embodiments represent in detail the case where the n channel is used, Si, Se or the like is effective in place of Zn as the ions to be implanted when the p channel (two-dimensional positive hole gas) is used.

As to the semiconductor material, the present invention is effective for the other heterojunction systems such as InP/InGaAsP, InAlAs/InAsP, and so forth.

Another ion seed for causing the disorder of the heterojunction is fluorine atom F. In this case, the heterojunction can be disordered by heating at a relatively low temperature of from 650° to 700° C. for about two hours without activation of F in GaAs and the F atoms diffuses and get out from GaAs.

Embodiment 3

An example which causes the disorder of the heterojunction by use of the F atoms will be explained.

Figure 5:
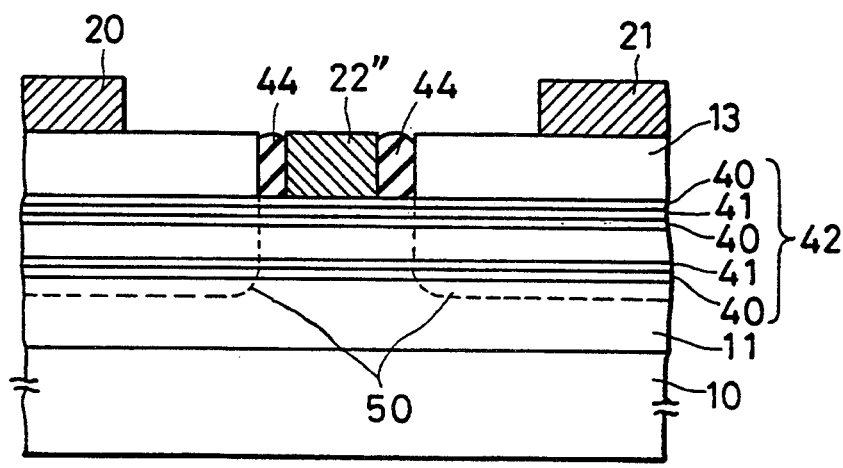
FIG. 5 is a sectional view of 2DEG-FET in the third embodiment of the present invention.

2DEG-FET of the type wherein the superlattice exists below the gate electrode will be explained with reference to FIG. 5. After a 1 $\mu$m-thick undoped GaAs layer 11 is formed on a semi-insulating GaAs substrate 10 by MBE, a 3 nm-thick undoped $Al_xGa_{1-x}As$ (approximately, $0.3 \leq x \leq 1.0$) layer 40 and a 3 nm-thick $n^+$GaAs layer 41 containing $5 \times 10^{18}$ cm$^{-3}$ of Si are alternately laminated in eight periods to form the superlattice 42. Then, a 160 nm-thick $n^+$GaAs layer 13 containing $5 \times 10^{18}$ cm$^{-3}$ of Si is formed.

Thereafter, the $n^+$GaAs layer 13 at which the gate portion is formed is selectively recessed by use of a photoresist as the mask and a 10 nm-thick SiN layer 44 is formed by optical CVD and SiN 44 is left only on the sidewall portion of $n^+$GaAs by anisotropic dry etching. Then, 10 nm-thick $LaB_6$ 22" is deposited as the gate metal and the gate electrode is formed by lift-off. Subsequently, the F atoms are implanted in the dose of $10^{14}$ cm$^{-2}$ at an acceleration voltage of 100 keV and after deposition of 200 nm-thick $SiO_2$ film, annealing is carried out at 650° C. for 2 hours in order to cause the disorder of the heterojunction and to form the source-drain regions. Dotted region represented by reference numeral 50 represents the disordered region.

Subsequently, the source-drain electrodes 20, 21 are formed by depositing AuGe/Ni/Au and alloying them.

In this embodiment, the F atoms are annealed at 650° C. In this case, the superlattice is extremely fragile and the heterojunction can be disordered by effecting annealing at 400° C. for 2 hours. The disordered region is represented by dotted line 50.

Embodiment 4

Figure 6:
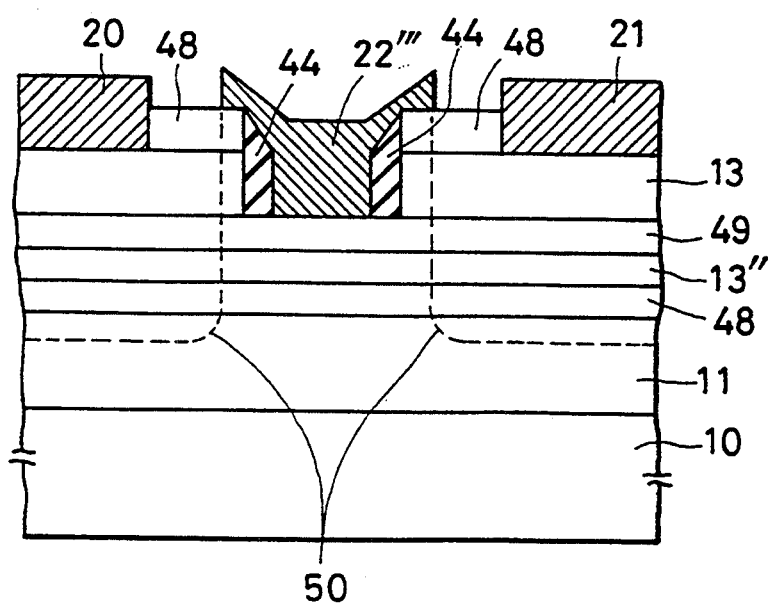
FIG. 6 is a sectional view of a heterojunction MESFET in the fourth embodiment of the present invention.

Still another embodiment of the present invention, wherein the invention is applied to heterojunction MESFET, is shown in FIG. 6.

A 0.3 $\mu$m-thick undoped GaAs layer 11, a 0.2 $\mu$m-thick undoped $Al_xGa_{1-x}As$ ($x \sim 0.3$) layer 48, a 10 nm-thick $n^+$GaAs layer 13" containing $3 \times 10^{18}$ nm$^{-3}$ of Si, a 20 nm-thick undoped $Al_xGa_{1-x}As$ ($x \sim 0.3$) layer 49 and a 160 nm-thick $n^+$GaAs layer 13 containing $3 \times 10^{18}$ cm$^{-3}$ of Si are formed by MBE on a semi-insulating GaAs substrate 10. Subsequently, a 300 nm-thick $SiO_2$ layer is deposited by CVD and the $SiO_2$ layer 48 and the $n^+$GaAs layer 13 at the gate electrode portion are removed selectively by use of a photoresist. Thereafter, a 150 nm-thick SiN layer 44 is formed by optical CVD and is then dry-etched anisotropically to remove the photoresist. Furthermore, 300 nm-thick WSi 22''' is deposited on the entire surface and the gate electrode is etched by use of the photoresist. Thereafter, F ions are implanted in the dose of $1 \times 10^{15}$ cm$^{-2}$ at an acceleration voltage of 100 keV and annealing is then effected at 650° C. for 2 hours using a CVD $SiO_2$. cap in order to disorder the heterojunction and to form the source-drain regions. Dotted region represented by reference numeral 50 is the disordered region. Next, the source-drain electrodes 20, 21 are formed.

Though Embodiments Nos. 3 and 4 illustrate the examples wherein the disorder is established by use of the F ions, the acceleration voltage, the dose and the annealing condition are generally from 30 to 200 keV, from $10^{12}$ to $10^{15}$ cm$^{-2}$ and from 400° to 700° C., respectively.

Cl, Br, I, At, and the like, are also effective besides the F atoms.

In accordance with the present invention, it is possible to obtain a semiconductor device having an extremely small source-drain parasitic resistance $R_{sg}$ in the case of 2DEG-FET and having an extremely small parasitic base resistance in the case of 2DEG-HBT by making broad the sharp heterojunction except for the two-dimensional carrier storage portion by, for example, causing the disorder of the GaAs/AlGaAs heterojunction.

Embodiment 5

The fifth embodiment of the present invention, wherein the invention is applied to 2DEG-FET, will be described. Though this embodiment deals with the case of a GaAs/AlGaAs system heterojunction crystal, the present invention can also be applied to other semiconductor materials such as InP, InGaAs, InAlAs, InGaAsP, and the like.

Figure 7A:
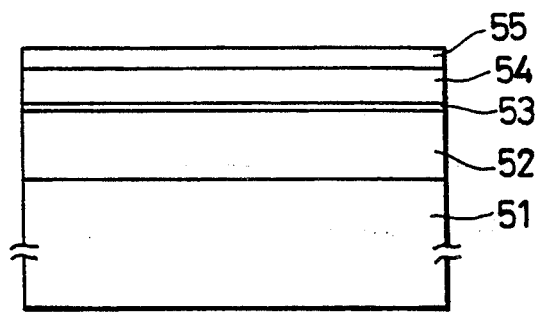
FIGS. 7(a), 7(b) and 7(c) are sectional views showing the fabrication steps of 2DEG-FET in the fifth embodiment of the present invention.
Figure 7B:
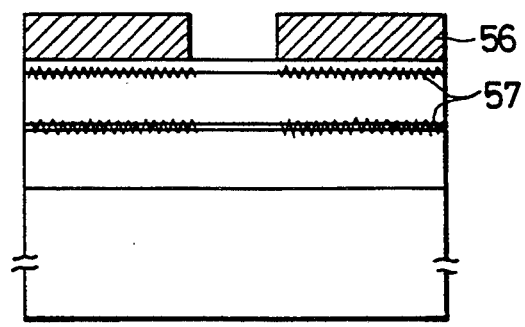
Figure 7C:
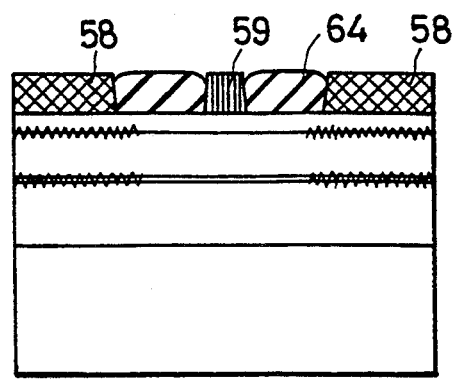
Figure 8:
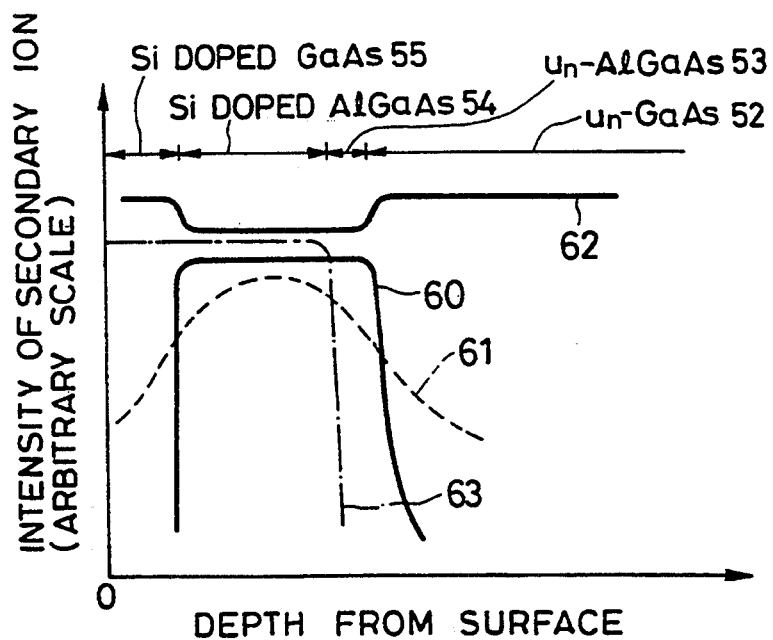
FIG. 8 is a diagram showing the distribution of the secondary ion intensity of Ga, Al and Si in the direction of depth by secondary ion mass analysis in FIG. 7(b)

FIGS. 7(a) to (c) show the fabrication steps of this embodiment. In FIG. 7(a), a 0.5 $\mu$m-thick undoped GaAs layer 52, a 60 Å-thick undoped AlGaAs layer 53, a 300 Å-thick n-type AlGaAs layer 54 and a 200 Å-thick n-type GaAs layer 55 are laminated on a semi-insulating GaAs substrate 51 by molecular beam epitaxy or metal organic vapor phase epitaxy.

Referring then to FIG. 7(b), an SiO$_2$ layer or an SiN layer 56 is deposited on the entire surface of the substrate by metal organic vapor phase epitaxy, sputtering or plasma-induced chemical vapor phase growing method. Next, the insulating layer 56 is removed selectively by reactive ion etching and is left only in the ohmic region of the transistor. Heat-treatment is then carried out at 900° C. for 30 seconds in the atmosphere of an AsH$_3$+H$_2$ mixed gas. At this time, only the heterojunction below the insulating layer gets disordered selectively and the heterojunction at the portions not covered with the insulating layer 56 remains as such.

The process then shifts to FIG. 7(c). After the insulating layer 56 is removed, an SiO$_2$ film 64 is deposited on the entire surface and the SiO$_2$ film 64 of the disordered region is removed. The source-drain electrode 58 is formed by lift-off of an AuGe alloy. Similarly, Al is formed by lift-off in the region where the heterojunction is kept to obtain the gate electrode 59. There is thus completed a modulated doped field effect transistor.

According to this embodiment, the heterojunction interface can be disordered selectively without ion implantation and the transistor which can reduce the parasitic resistance of the ohmic region and moreover, is free from the short channel effect can be fabricated.

Embodiment 6

Figure 9:
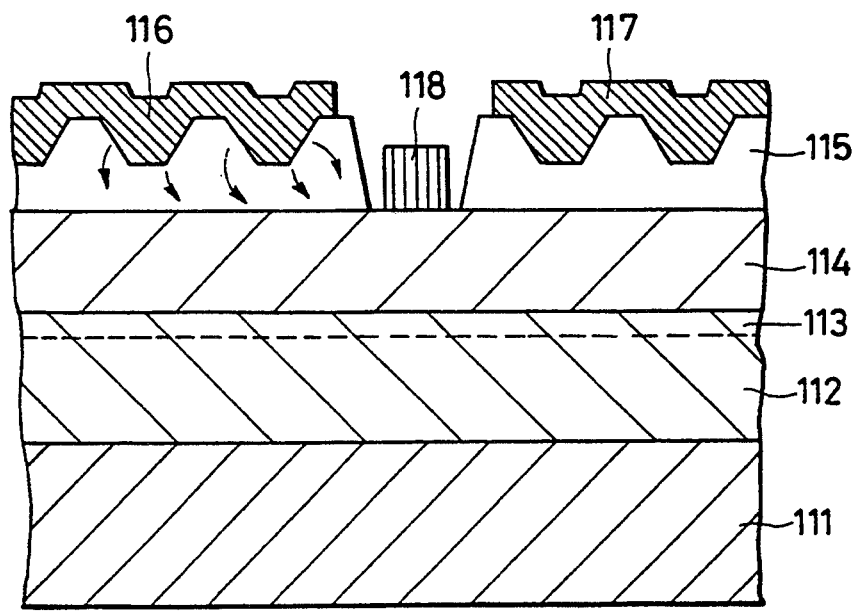
FIG. 9 is a sectional view of 2DEG-FET in the sixth embodiment of the present invention.
Figure 10:
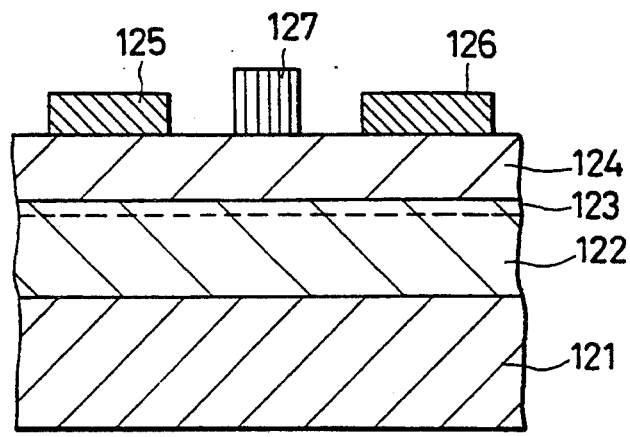
FIG. 10 is a sectional view of conventional 2DEG-FET.
Figure 11:
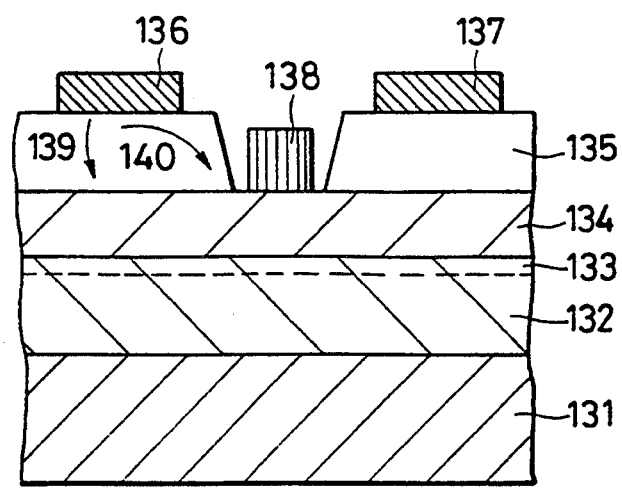
FIG. 11 is a sectional view showing an improved example of 2DEG-FET.

The sixth embodiment of the present invention, which is applied to 2DEG-FET, will be explained with reference to FIG. 9.

A 1 μm-thick undoped GaAs layer 112, a 300 Å-thick n-type AlGaAs layer 114 into which $2\sim3\times10^{18}$ cm$^{-3}$ of Si is doped and a 2,000 Å-thick n+GaAs contact layer 115 into which $8\times10^{18}$ cm$^{-3}$ of Si is doped are formed sequentially on a semi-insulating GaAs substrate 111 of the (100) plane by MBE. Thereafter, a recess structure of a gate forming portion and a lattice structure on the surface of an n+GaAs contact layer 115 are formed by electron beam direct lithography technique. The trench of the lattice structure extends in the <011> direction, and a 600 Å-deep trench is formed by wet etching by using a photoresist as the mask. Next, the gate electrode 118 and the source-drain electrodes 116, 117 are formed by lift-off of Al and AuGe/Ni/Au, respectively.

A satisfactory heterojunction interface can be obtained and a high speed operation can be accomplished by an undoped AlGaAs spacer layer, which is some dozens of angstorm thick, between the AlGaAs layer 114 as the electron donor layer and the undoped GaAs layer 112.

A great effect can be obtained by disposing the lattice structure of the contact layer described above only in the source electrode contact layer or at a part of the contact layer.

Higher performance of the semiconductor device capable of controlling the current paths can be accomplished by controlling partially the periods of the lattice structure and the width and depth of the trench.

Though the embodiment described above represents the field effect transistor utilizing the two-dimensional electron gas stored in one set of heterojunction interface, the semiconductor layer structures below the contact layer may have any structure and other compound semiconductors can of course be used as the semiconductor materials for each layer including the contact layer.

According to this embodiment, the contact resistance between the source electrode and the contact layer and the parasitic resistance between the gate and source electrodes can be reduced remarkably, and transconductance can be improved by 30 to 40% in comparison with the prior devices.

Embodiment 7

Figure 13A:
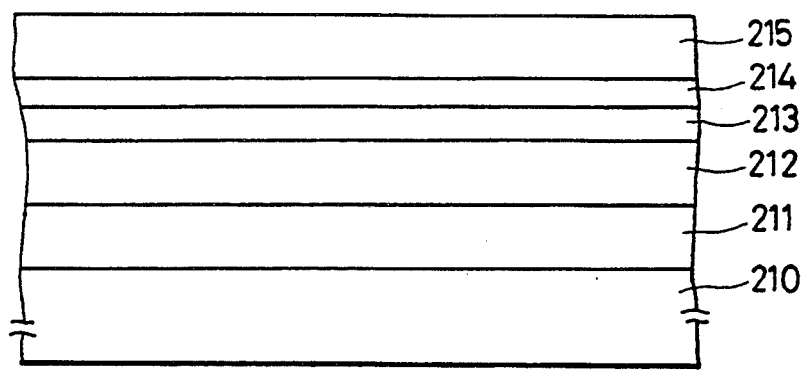
FIGS. 13(a), 13(b) and 13(c) are sectional views showing the fabrication steps of HBT and GaAs MESFET in the seventh embodiment of the present invention.
Figure 13B:
Figure 13C:
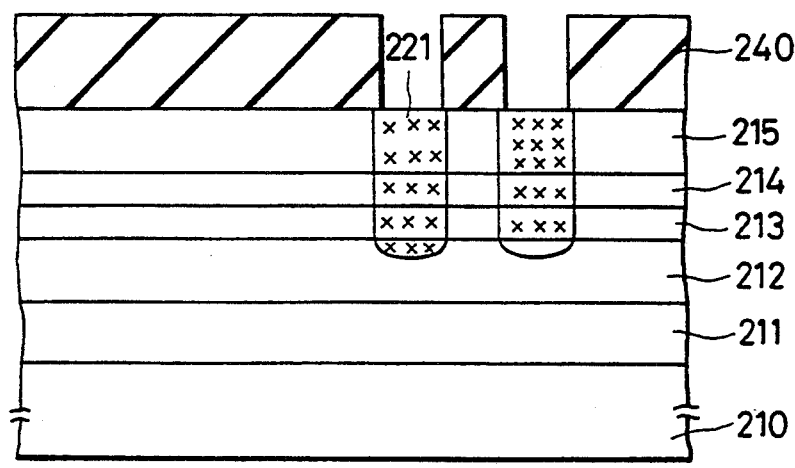

The seventh embodiment of the present invention, wherein HBT and GaAs MEFET are formed on the same substrate, will be described with reference to FIG. 13.

A 400 nm-thick n+GaAs layer 211 containing $3\times10^{18}$ cm$^{-3}$ of Si, a 300 nm-thick n$^-$GaAs layer 212 containing $1\times10^{15}$ cm$^{-3}$ of Si, a 100 nm-thick p+GaAs layer 213 containing $5\times10^{18}$ cm$^{-3}$ of Be, a 100 nm-thick undoped (p$^-$:$\sim10^{15}$ cm$^{-3}$ level) Al$_x$Ga$_{1-x}$As (x$\sim$0.3) layer 214 and a 200 nm-thick undoped GaAs layer 215 are formed on a semi-insulating GaAs substrate 210 by MBE (molecular beam epitaxy; FIG. 13 (a)).

Next, after a 500 nm-thick SiO$_2$ layer 240 is formed on the entire surface by thermal CVD, a window for taking out the base region is bored by lithography and Mg ions are then implanted in the dose of $10^{14}$ cm$^{-2}$ at an acceleration voltage of 250 keV using the SiO$_2$ layer as the mask. Then, SiO$_2$ is deposited in the thickness of 200 nm on the entire surface, and the Mg ions are activated by lamp annealing to form the base extension region 221 (FIG. 13(b)).

Subsequently, a photoresist 241 and SiN 242 inside the photoresist are deposited by optical CVD and Si ions are implanted in the dose of $3\times10^{13}$ cm$^{-2}$ at an acceleration voltage of 175 keV. The emitter region 220 is formed selectively by ordinary heat-treatment (FIG. 13 (c)).

Figure 12A:
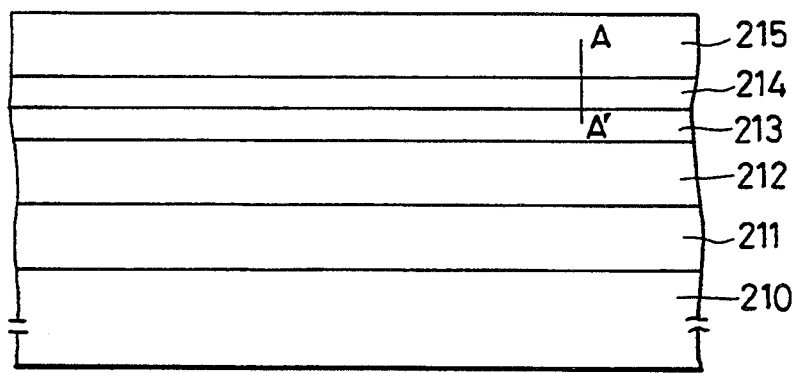
FIGS. 12(a) and 12(b) are sectional views showing the fabrication steps and useful for explaining the principle of HBT and MESFET integrated circuit in the seventh embodiment of the present invention.
Figure 12B:
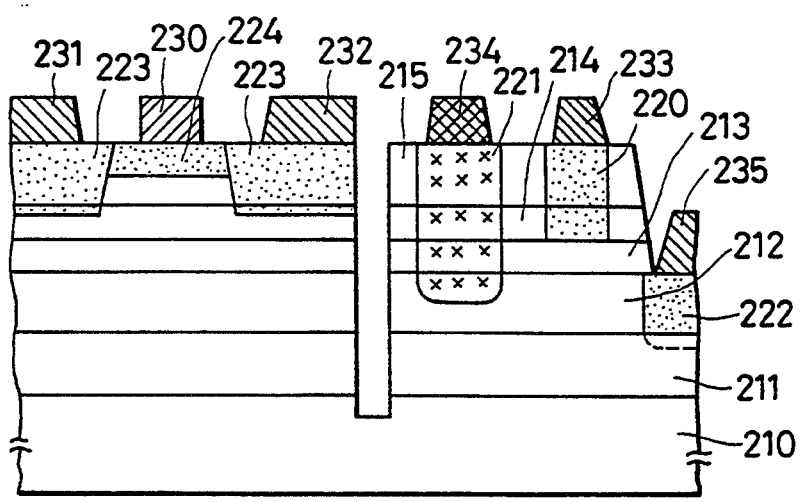
Figure 12C:
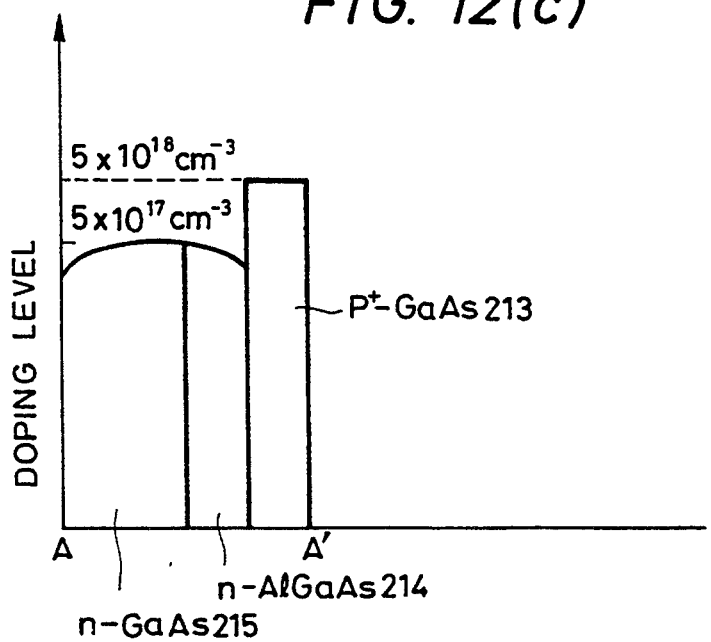
FIG. 12(c) is a distribution diagram of an impurity doping level at A-A' portion in FIG. 12(a)

Thereafter, the emitter electrode, the base electrode and the collector electrode of the FET portion are formed as shown in FIG. 12 (b).

Though this embodiment represents npn HBT, the present invention can also be applied in the same way to pnp HBT.

As described above, this embodiment uses epitaxial technique such as MBE only for the base layer for which controllability is most required, and forms the emitter or collector region by ion implantation so that FET, resistance SBD (Schottky Barrier Diode), and the like, can be formed easily inside the same substrate as HBT. For example, since GaAs MESFET can be formed extremely easily in the undoped layer formed at the upper part of the base layer, a plurality each of HBT and FET can be formed easily inside the same substrate.

Furthermore, since the emitter region is formed by ion implantation, the emitter-base parasitic capacitance can be reduced remarkably.

Although the present invention has thus been described with reference to some preferred embodiments thereof, it could be understood by those skilled in the art that various changes or modifications can be made without departing from the spirit and scope thereof.

What is claimed is:

1. A semiconductor device having a two-dimensional electron gas (2-DEG) as an active layer, comprising:
   source, drain and gate electrodes on a surface of a semiconductor body which includes a multilayered arrangement, said source and drain electrodes are respectively spaced-apart from said gate electrode,
   wherein said multilayered arrangement includes a heterojunction at a portion thereof orthogonally underlying said gate electrode and includes first and second type cap layers in ohmic contact with said source and drain electrodes, respectively, and wherein those portions of said multilayered arrangement orthogonally underlying said source and drain electrodes and spacings between said source electrode and said gate electrode and between said drain electrode and said gate electrode are characterized as having disordered junctions.

2. A semiconductor device according to claim 1, wherein said heterojunction is formed at an interface of an undoped GaAs layer and an n-type $Al_xGa_{1-x}As$ layer formed thereon, where x is taken from $0.1 \leq x \leq 0.4$, and wherein said two-dimensional electron gas active layer is effected at a portion of said multilayered arrangement in which said undoped GaAs layer and said n-type $Al_xGa_{1-x}As$ layer form said heterojunction.

3. A semiconductor device according to claim 2, wherein said first and second cap layers are low resistivity n+-type semiconductor layers formed directly on said n-type $Al_xGa_{1-x}As$ layer.

4. A multi-layered semiconductor device according to claim 3, wherein said low resistivity n+-type semiconductor layers are comprised from an n+-type GaAs layer.

5. A multi-layered semiconductor device according to claim 4, wherein said undoped GaAs layer, said n-type $Al_xGa_{1-x}As$ layer and said n+-type GaAs layer have thicknesses of about 500 nm, of about 50 nm and of about 20 to 160 nm, respectively.

6. A semiconductor device according to claim 1, wherein said multilayered arrangement includes a superlattice structure on an undoped GaAs layer, said superlattice structure includes a plurality of undoped $Al_xGa_{1-x}As$ layers, in which x is about 0.3 where said heterojunction is effected, and a plurality of n+-type GaAs layers which are respectively interposed between pairs of said undoped $Al_xGa_{1-x}As$ layers.

7. A semiconductor device according to claim 6, wherein said undoped GaAs layer has a thickness of about 1 μm and is formed on a semi-insulating GaAs substrate, said undoped $Al_xGa_{1-x}As$ layers and said n+-type GaAs layers, doped with Si ions, of said superlattice structure have thicknesses of about 3 nm, and wherein the uppermost n-type $Al_xGa_{1-x}As$ layer of said superlattice structure has formed thereon first and second low resistivity contact n+-type GaAs regions, respectively corresponding to said first and second cap layers, each having a thickness of about 160 nm and a doping concentration of Si ions of about $5 \times 10^{18}$ cm$^{-3}$, said first and second contact regions have respectively formed thereon source and drain electrodes, and a gate electrode thereof is formed directly on said superlattice structure.

8. A semiconductor device according to claim 1, wherein said first and second cap layers are of low resistivity.

9. A semiconductor device according to claim 8, wherein said first and second cap layers have a common thickness taken from a range of 20 nm–160 nm.

10. A semiconductor device according to claim 9, wherein the thickness of each of said first and second low resistivity cap layers is about 160 nm.

11. A semiconductor device according to claim 8, wherein said heterojunction is effected at an interface of a layer of AlGaAs and a layer of undoped GaAs included in said multilayered arrangement.

12. A semiconductor device according to claim 1, wherein said heterojunction is effected at an interface of a layer of AlGaAs and a layer of undoped GaAs included in said multilayered arrangement.

13. A semiconductor device according to claim 1, wherein said heterojunction is provided at an interface of an n-type AlGaAs layer on an undoped GaAs layer, and wherein said first and second cap layers are of low resistivity and n-type conductivity.

14. A semiconductor device according to claim 1, wherein said first and second cap layers are n+-type GaAs layers, respectively.

15. A semiconductor device having a two-dimensional electron gas (2-DEG) as an active layer, comprising:
source, drain and gate electrodes on a surface of a semiconductor body which includes at least an n-type AlGaAs layer on a GaAs layer, said source and drain electrodes are respectively spaced-apart from said gate electrode,
wherein said semiconductor body includes a heterojunction, effected at an interface of said n-type AlGaAs layer on said GaAs layer, at a portion of said semiconductor body orthogonally underlying said gate electrode and includes first and second high conductivity type cap layers in ohmic contact with said source and drain electrodes, respectively, and
wherein portions of said semiconductor body orthogonally underlying said source and drain electrodes and spacings between said source electrode and said gate electrode and between said drain electrode and said gate electrode are characterized as having junctions between layers that are disordered.

16. A semiconductor device according to claim 15, wherein said first and second cap layers are heavily-doped layers interposed between said source electrode and said n-type AlGaAs layer and between said drain electrode and said n-type AlGaAs layer, respectively, and wherein said first and said second cap layers are precluded from direct contact to said gate electrode.

17. A semiconductor device according to claim 16, wherein said GaAs layer includes an undoped GaAs layer interposed between a semi-insulating substrate and said n-type AlGaAs layer.

18. A semiconductor device according to claim 1, wherein said first and second cap layers are heavily-doped layers and are precluded from direct contact to said gate electrode.

* * * * *